US009252660B2

(12) United States Patent
Burlingame et al.

(10) Patent No.: US 9,252,660 B2
(45) Date of Patent: Feb. 2, 2016

(54) SYSTEM AND METHOD FOR GENERATING A REGULATED BOOSTED VOLTAGE USING A CONTROLLED VARIABLE NUMBER OF CHARGE PUMP CIRCUITS

(71) Applicants: Efram Burlingame, San Diego, CA (US); Stephen Kosic, San Diego, CA (US)

(72) Inventors: Efram Burlingame, San Diego, CA (US); Stephen Kosic, San Diego, CA (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 13/631,765

(22) Filed: Sep. 28, 2012

(65) Prior Publication Data

US 2014/0091773 A1    Apr. 3, 2014

(51) Int. Cl.
*H02M 7/00* (2006.01)
*H02M 3/07* (2006.01)
*H03F 3/45* (2006.01)

(52) U.S. Cl.
CPC ............... *H02M 3/07* (2013.01); *H02M 3/073* (2013.01); *H03F 3/45475* (2013.01); *H02M 2003/077* (2013.01); *H03F 2200/78* (2013.01); *H03F 2203/45551* (2013.01)

(58) Field of Classification Search
CPC ........................................................ H02M 3/07
USPC ......... 323/268, 271, 272, 282, 283, 284, 286, 323/350, 351; 363/59, 60, 65; 327/148, 327/157, 536; 307/109, 110
See application file for complete search history.

(56) References Cited

U.S. PATENT DOCUMENTS

| | | | |
|---|---|---|---|
| 6,226,193 B1 * | 5/2001 | Bayer et al. | 363/59 |
| 7,239,198 B1 * | 7/2007 | Drapkin et al. | 327/563 |
| 8,223,576 B2 * | 7/2012 | Yang et al. | 365/226 |
| 2003/0038669 A1 * | 2/2003 | Zhang | 327/536 |
| 2003/0122610 A1 * | 7/2003 | Zeng et al. | 327/536 |
| 2004/0170035 A1 * | 9/2004 | Chen et al. | 363/65 |
| 2007/0229038 A1 | 10/2007 | Lin | |
| 2008/0018411 A1 | 1/2008 | Feng et al. | |
| 2009/0039947 A1 | 2/2009 | Williams | |
| 2009/0097285 A1 * | 4/2009 | Cook et al. | 363/60 |
| 2011/0069563 A1 * | 3/2011 | Castaldo et al. | 365/189.11 |

(Continued)

OTHER PUBLICATIONS

European Search Report and Search Opinion issued in counterpart European application No. 13185158.6, communication dated Jan. 8, 2015.

*Primary Examiner* — Adolf Berhane
*Assistant Examiner* — Alex Torres-Rivera
(74) *Attorney, Agent, or Firm* — Kenyon & Kenyon LLP (57) ABSTRACT

A system, method, and computer program product for generating a regulated boosted load voltage. A comparator may use reduced versions of a reference voltage, a supply voltage, and a fed-back output load voltage to determine whether the output load voltage requires adjustment. If so, a controller may responsively vary the number of voltage boosting charge pumps connected in parallel to the load to best match a target voltage. The target voltage may be the reference voltage plus the supply voltage. A counter may track the number of active charge pumps, and may increment or decrement the number more slowly than the charge pumps operate. Loop gain may be limited by an integrating filter to prevent oscillation. The embodiments are of particular utility for signal conversion circuitry as they eliminate difficulties arising from gate-source voltage inadequacies and differences in switch transistors. A wider range of reference voltages may be accommodated.

34 Claims, 10 Drawing Sheets

(56) References Cited

U.S. PATENT DOCUMENTS

| | | |
|---|---|---|
| 2011/0267019 A1* | 11/2011 | Krishnamurthy et al. .... 323/283 |
| 2011/0309877 A1* | 12/2011 | Gorisse ........................ 327/536 |
| 2012/0153910 A1* | 6/2012 | Bulzacchelli et al. ........ 323/272 |
| 2013/0015831 A1* | 1/2013 | Wong et al. ................... 323/282 |
| 2013/0214944 A1* | 8/2013 | Kosic ............................ 341/110 |

* cited by examiner

SYSTEM AND METHOD FOR GENERATING A REGULATED BOOSTED VOLTAGE USING A CONTROLLED VARIABLE NUMBER OF CHARGE PUMP CIRCUITS

BACKGROUND

The present invention relates to voltage booster systems and, in particular, to voltage booster systems that dynamically respond to changing demands of load device(s) that are to be powered by the booster systems. The voltage regulator may be implemented in an integrated circuit.

Voltage booster systems are used in a variety of electrical designs. Modern integrated circuits receive power from external supplies at a fixed voltage, such as 1.8V. Circuit designs within the integrated circuits may call for supply voltages at higher levels, for example up to 3.2V. In such circumstances, a voltage booster system may generate a voltage at a higher level to supply those circuits (herein, "loads").

Voltage booster systems are typically inefficient. They may include charge pumps or other circuits that push charge to the load at a predetermined rate. The load devices, however, typically consume power at rates that vary based on operational parameters based on dynamically changing utilization of the load, signal content being processed by the load, or other ambient circumstances. Thus, the voltage booster systems rarely meet the power requirements of the load devices precisely. When the output of a voltage booster system does not match the power requirements of its associated load device, it leads to inefficient power consumption by the integrated circuit. Accordingly, the inventors have identified a need in the art for a voltage booster system that varies its output dynamically in response to power demands of its load device.

DETAILED DESCRIPTION

Embodiments of the invention provide a voltage booster system that responds dynamically to changing power demands of its associated load. The voltage booster system may include an array of charge pumps each having an output coupled to a common output, which is to be connected to the load. The voltage booster system may include a control system that compares a voltage at the output to a target voltage. The control system may activate a variable number of the charge pumps in response to the comparison. Thus, the voltage booster system may deliver power to a load that varies in accordance with power consumption of the load.

Figure 1:
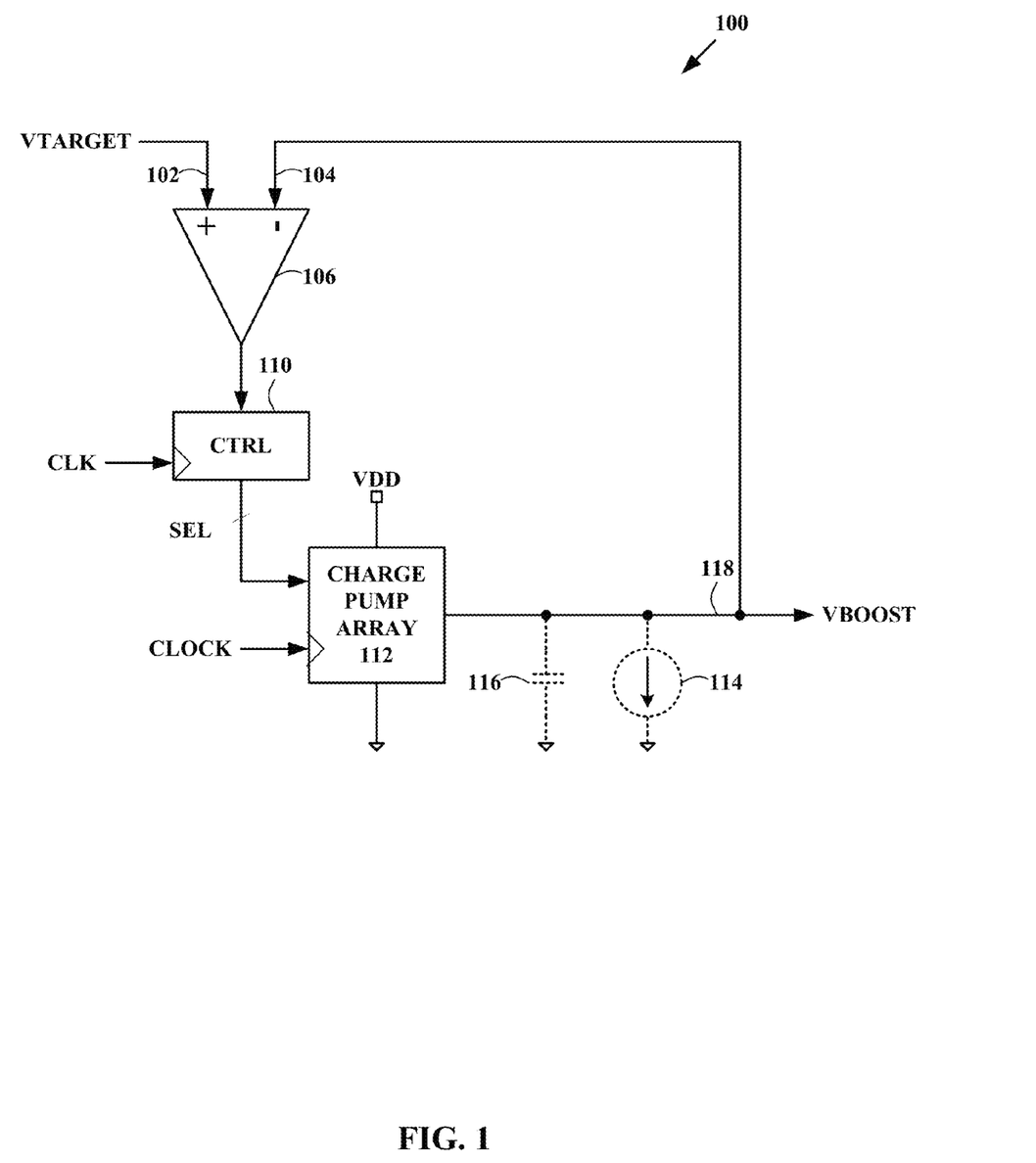
FIG. 1 is a diagram depicting an exemplary voltage supply circuit according to one aspect of the present invention.

FIG. 1 is a circuit diagram depicting an exemplary voltage supply circuit 100 according to one aspect of the present invention. The circuit 100 may provide a boosted voltage $V_{BOOST}$ to supply power to a load device (represented as a current drain 114). The circuit 100 may measure the voltage $V_{BOOST}$ at the output and provide only as much power as is necessary to maintain the output voltage $V_{BOOST}$ at a desired level. The circuit 100 may be fabricated as an integrated circuit.

The circuit 100 may include a comparator 106, a controller 110 and an array of charge pumps 112. The charge pump array 112 may include a plurality of charge pumps (not shown) each having its output coupled to a common output node 118. The charge pumps may be powered by supply voltages (e.g. $V_{DD}$ and ground) that are available to the integrated circuit, and may generate output voltages (which are combined at $V_{BOOST}$) at a level that is beyond the supply voltages. The comparator 106 may have inputs 102, 104 connected to a target voltage $V_{TARGET}$ and to the output node $V_{BOOST}$. The controller 110 may have an input coupled to the comparator's 106 output. The controller 110 may output a selection signal SEL to the charge pump array 112 that determines how many charge pumps in the array 112 may be engaged to deliver a current that, with the load, is the desired boosted voltage at the output node 118. The circuit 100 thus may form a digital control loop that selects, by comparing an output voltage $V_{BOOST}$ with a desired target voltage $V_{TARGET}$, how many charge pump circuits to enable to generate an output load voltage that matches the target voltage.

During operation, the output voltage $V_{BOOST}$ at the output terminal 118 may vary as the charge pump array 112 outputs charge and the load device 114 consumes power. The comparator 106 may generate an output signal based on a comparison of the output voltage $V_{BOOST}$ and the target voltage $V_{TARGET}$. Target voltage $V_{TARGET}$ may be externally provided, or may be generated internally from an available supply voltage using for example a conventional voltage reference circuit. Such internally generated voltage references may be limited in their voltage magnitude, output current, and may vary with temperature, the supply voltage from which they are obtained, load current, or manufacturing variations. $V_{TARGET}$ may therefore also be created by augmenting an available supply voltage such as $V_{DD}$ with an internally generated reference voltage $V_{REF}$ that may be any particular value within the available supply voltage range. This target voltage formulation is of particular utility, to be described.

The controller 110 may sample the comparator's output at sampling intervals as determined by a driving clock signal CLK and may determine therefrom how many of the charge pumps are to be activated. The controller 110 may activate the charge pumps by providing the selection signal SEL to the charge pump array 112. The selected charge pumps in array 112 may provide charge to the load device in accordance with a CLOCK signal and, thereby, may contribute to replenishment of the $V_{BOOST}$ voltage. CLOCK may comprise a pair of non-overlapping pulsed signals for switched-capacitor circuit operation. The charge pump array clock may operate at a higher frequency than the controller clock, for example the CLOCK frequency may be an integer multiple of the CLK frequency, so that the controller 110 allows the charge pump array 112 to stabilize to some extent before making adjustments.

As noted, charge pumps typically are powered by external supply voltages, shown as $V_{DD}$ and ground. Internal capacitors (not shown) within the charge pumps charge to $V_{DD}$ in a precharge phase of operation and then either push or pull the capacitor charge to/from an output node depending on orientation of connections between the internal capacitor and the output. Thus, the charge pumps may for example generate an output voltage $V_{BOOST}$ ranging from $2*V_{DD}$ to $-V_{DD}$ depending on the circuit topology and load. In the system of FIG. 1, the reference voltage $V_{REF}$ used to generate $V_{TARGET}$ may be set between ground and $V_{DD}$ for a push configuration or between ground and $-V_{DD}$ for a pull configuration.

By way of example, the system of FIG. 1 may be implemented in an integrated circuit in which $V_{DD}$ is 1.8V and $V_{REF}$ is 1.4V, and $V_{TARGET}$ may be the sum of these two voltages. In such a configuration, the controller 110 may activate a number of charge pumps in the array 112 to maintain the output node 118 at a $V_{TARGET}$ value of 3.2V for example. The number of charge pumps may vary during operation as the load 114 drains variable amounts of current during its operation.

In an embodiment, a capacitor 116 may be provided at the output node 118. The capacitor 116 may be charged by the charge pump array 112 during operation. It may provide a charge reservoir for the load 114. Thus, as current drain of the load 114 varies, the capacitor 116 may smooth out fluctuations of the output voltage $V_{BOOST}$ that otherwise might occur without such a capacitor 116.

Figure 2:
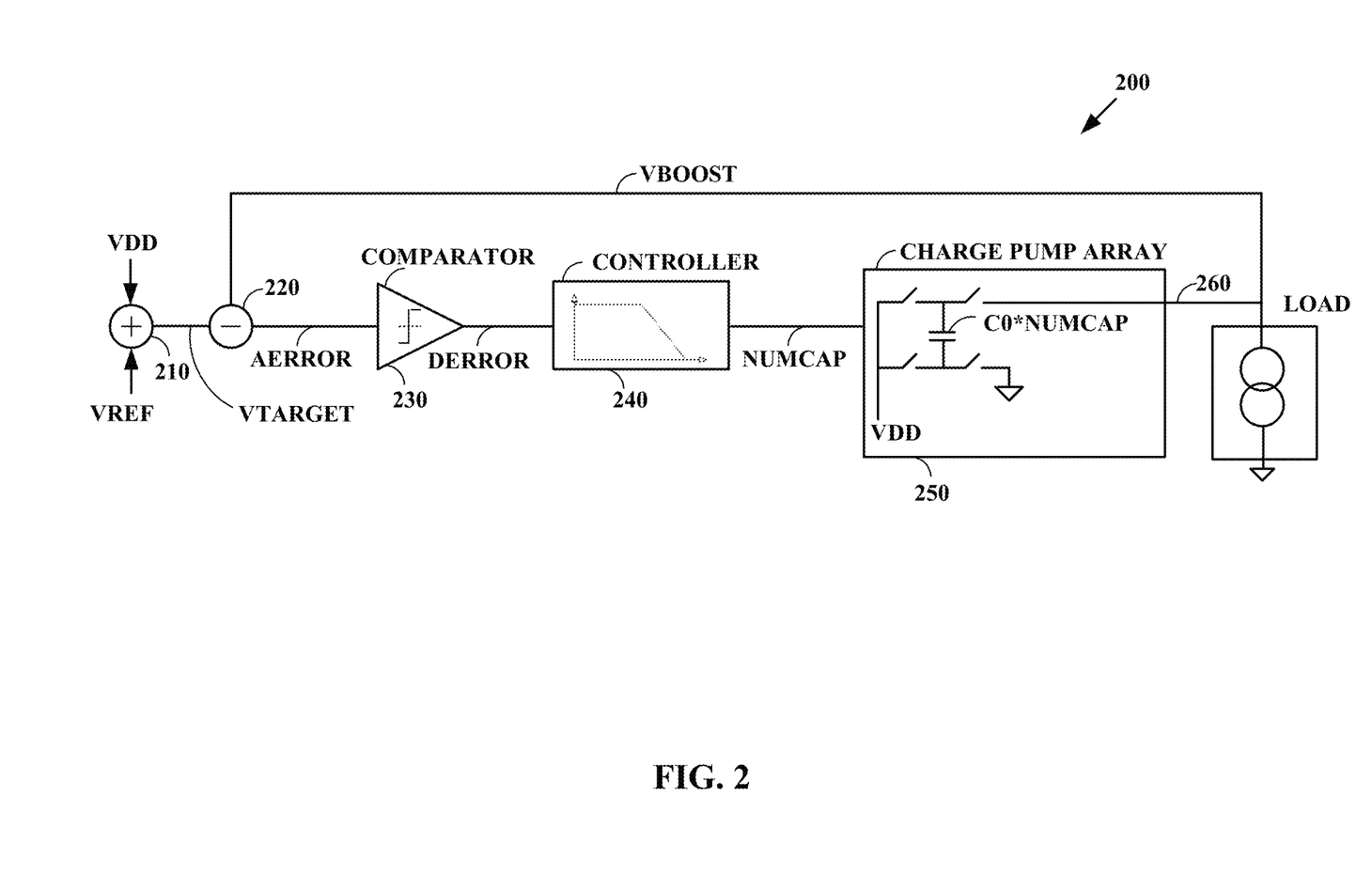
FIG. 2 is a functional diagram of an exemplary voltage supply circuit diagram according to one aspect of the present invention.

Referring now to FIG. 2, a functional diagram of a voltage supply circuit 200 is shown according to one aspect of the present invention. The voltage supply circuit 200 may comprise an adder 210, a subtractor 220, a comparator 230, a controller 240 and a charge pump array 250. The reference voltage $V_{REF}$ may be generated from supply voltage $V_{DD}$ by conventional circuitry (not shown) or may be provided externally. In this embodiment, $V_{TARGET}$ is $V_{DD}+V_{REF}$, though this is merely exemplary. The subtractor 220 may generate a differential voltage AERROR that represents a difference between the $V_{BOOST}$ voltage at an output node 260 and the target voltage. The AERROR signal may be input to the comparator 230. The AERROR signal may represent an error in the $V_{BOOST}$ signal.

The comparator 230 may determine if AERROR is greater than or less than zero volts. The comparator 230 may output a binary adjustment signal, called "DERROR." The DERROR signal may indicate in a first state that fewer charge pumps are required and, in a second state, that a greater number of charge pumps are required.

The DERROR signal may be input to the controller 240. The controller 240 may keep a running tally of decisions from the comparator 230 in an accumulator, and may estimate a number of charge pumps to be engaged within the charge pump array 250. In one embodiment, the accumulator may be embodied as a digital filter. Alternatively, the accumulator may be provided as an integrator. In a further embodiment, the accumulator may be embodied as an up/down counter that increments or decrements in response to outputs from the comparator 230. In each of the embodiments, the controller 240 may configure responsiveness of the control loop to dampen cycle-to-cycle adjustments from the comparator 230 to create a stable loop. The accumulator may output a selection signal NUMCAP that indicates how many charge pump capacitors are to be activated in the charge pump array 250. The selection signal NUMCAP may be a multi-bit signal.

Figure 3A:
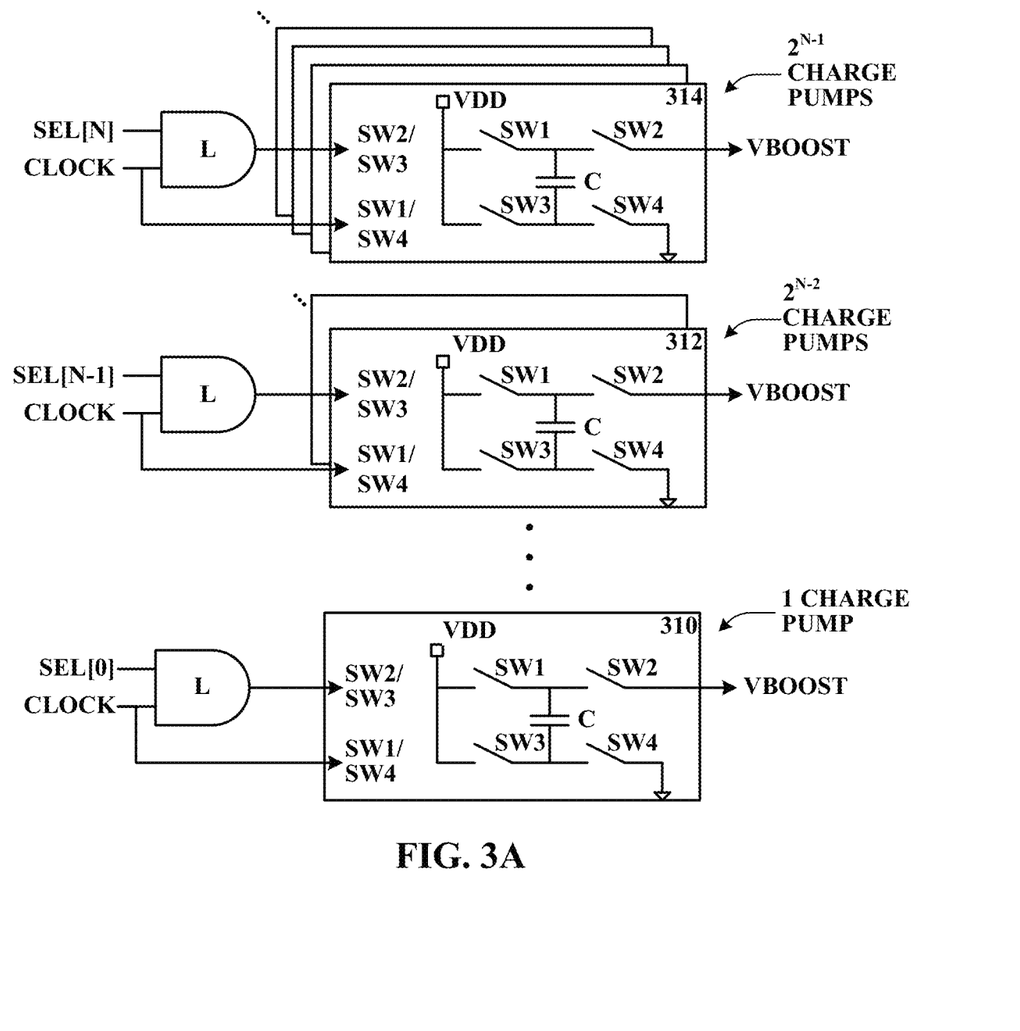
FIG. 3A is a diagram depicting an exemplary charge pump circuit according to one aspect of the present invention.

Referring now to FIG. 3A, a diagram of an array of exemplary charge pumps is shown according to one aspect of the invention. In one embodiment, for a NUMCAP signal having a bit width of N, the array may include $2^N$ charge pumps of unitary size. In another embodiment, for a NUMCAP signal having a bit width of N, the array may include N charge pumps having a binary capacitance weighting among them.

FIG. 3A illustrates the structure of an exemplary charge pump array 300 of either embodiment. The array 300 may include a plurality of charge pumps 310-314, each associated with a predetermined bit position of an input selection signal SEL. The SEL signal may be a multi-bit digital signal having an arbitrary number N bit positions. In the embodiment illustrated in FIG. 3A, the charge pump array 300 may have $2^N$ charge pumps, each with a common structure. The charge pumps may be assigned to bit positions of the SEL signal in a binary weighted distribution pattern in which a most significant bit of the SEL signal is assigned $2^{N-1}$ charge pumps 314, a second-to-most bit position of the SEL signal is assigned $2^{N-2}$ charge pumps 312, etc. The distribution pattern may extend throughout the SEL signal to the least significant bit position, which may be assigned a single charge pump 310.

In this embodiment, each charge pump may include a capacitor C having first and second terminals, a plurality of control switches SW1-SW4 and a logic gate L. The first terminal of the capacitor C may be coupled to $V_{DD}$ by a first switch SW1 and to the output node $V_{BOOST}$ by a second switch SW2. The second terminal of the capacitor C may be coupled to $V_{DD}$ by a third switch SW3 and to ground by a fourth switch SW4. The switches SW1 and SW4 may be clocked in common to charge the capacitor C and the switches SW2 and SW3 may be clocked in common to push charge from the capacitor to the output node ($V_{BOOST}$).

The logic gate of each cell may combine the cell's selection signal with the CLOCK signal. In the implementation shown, the logic gates L are shown as AND gates, which control the switches SW2, SW3 that otherwise control delivery of charge to the output node. The logic gates L may receive the CLOCK signal on a first input and a respective bit of the SEL signal. Thus, for charge pump 310, the logic gate L receives CLOCK and SEL[0]. When SEL[0] is low, it may indicate that the charge pump 310 should not be activated and the logic gate L may prevent switches SW2, SW3 from connecting the capacitor C to the output node $V_{BOOST}$. Logic gates of the other bit positions may be similarly constructed, preventing the switches SW2, SW3 from connecting their capacitors C to the output node when the respective SEL bits (SEL[1], ... SEL[n-1], SEL[n]) indicate that the charge pumps should not be activated.

In the embodiment illustrated in FIG. 3A, the switches SW1, SW4 may receive the CLOCK signal directly, which allows the capacitors therein to charge in precharge phases of the CLOCK signal regardless of whether they are to be activated to deliver charge in a subsequent phase of the CLOCK signal. This embodiment allows for the capacitors to be recharged to $V_{DD}$ in the event that any charge loss occurs due to switch leakage or other effects. Other embodiments, however, permit the SEL signal to control precharge operations of the capacitors C as well.

As discussed above, FIG. 3A illustrates a binary weighted distribution of charge pumps, each having a capacitor of a common size C. Other embodiments of the present invention may accommodate use of charge pumps in which capacitors sizes vary in a binary weighting (e.g., a capacitor of an MSB charge pump 314 may have a capacitance $2^{N-1}$ *C as compared to a capacitor C of an LSB charge pump 310).

Figure 3B:
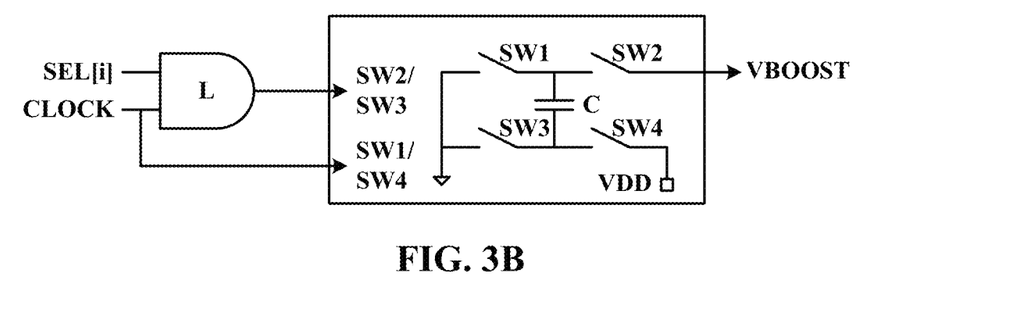
FIG. 3B is a diagram depicting an exemplary charge pump circuit for generating negative voltages according to one aspect of the present invention.

FIG. 3B illustrates an alternate charge pump circuit that may be arranged in an array (not shown) similar to that of FIG. 3A, but to instead provide a negative output voltage. The FIG. 3B charge pump circuit and related array may also be similarly controlled by logic circuitry like that of FIG. 3A. Any charge pump circuit or other voltage boosting circuit known in the art may be employed to form an array.

Figure 4A:
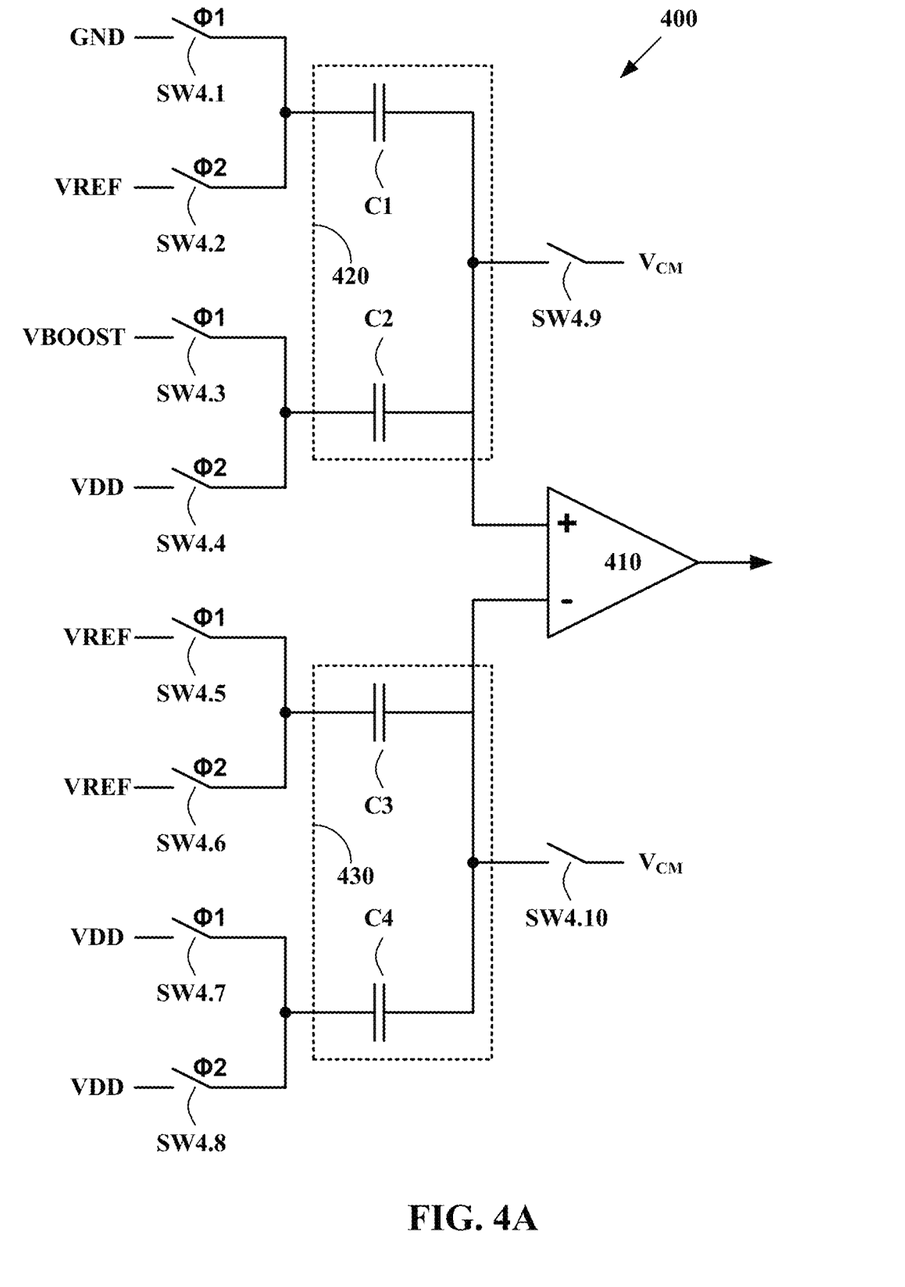
FIG. 4A is a diagram depicting an exemplary comparator circuit according to one aspect of the present invention.

FIG. 4A is a circuit diagram of a comparator system 400 according to an embodiment of the present invention. The system 400 may include a comparator 410, a pair of voltage dividers 420, 430 and a variety of control switches SW4.1-SW4.10. The control switches may selectively connect the voltage dividers 420 and 430 to voltages $V_{BOOST}$, $V_{DD}$, $V_{REF}$, and ground for example. Intermediate nodes within the voltage dividers 420, 430 may be input to the comparator 410. In the embodiment illustrated in FIG. 4A, the voltage dividers 420 and 430 are illustrated as capacitor-based but other implementations are permissible. The capacitors may all be of the same value.

Figure 4B:
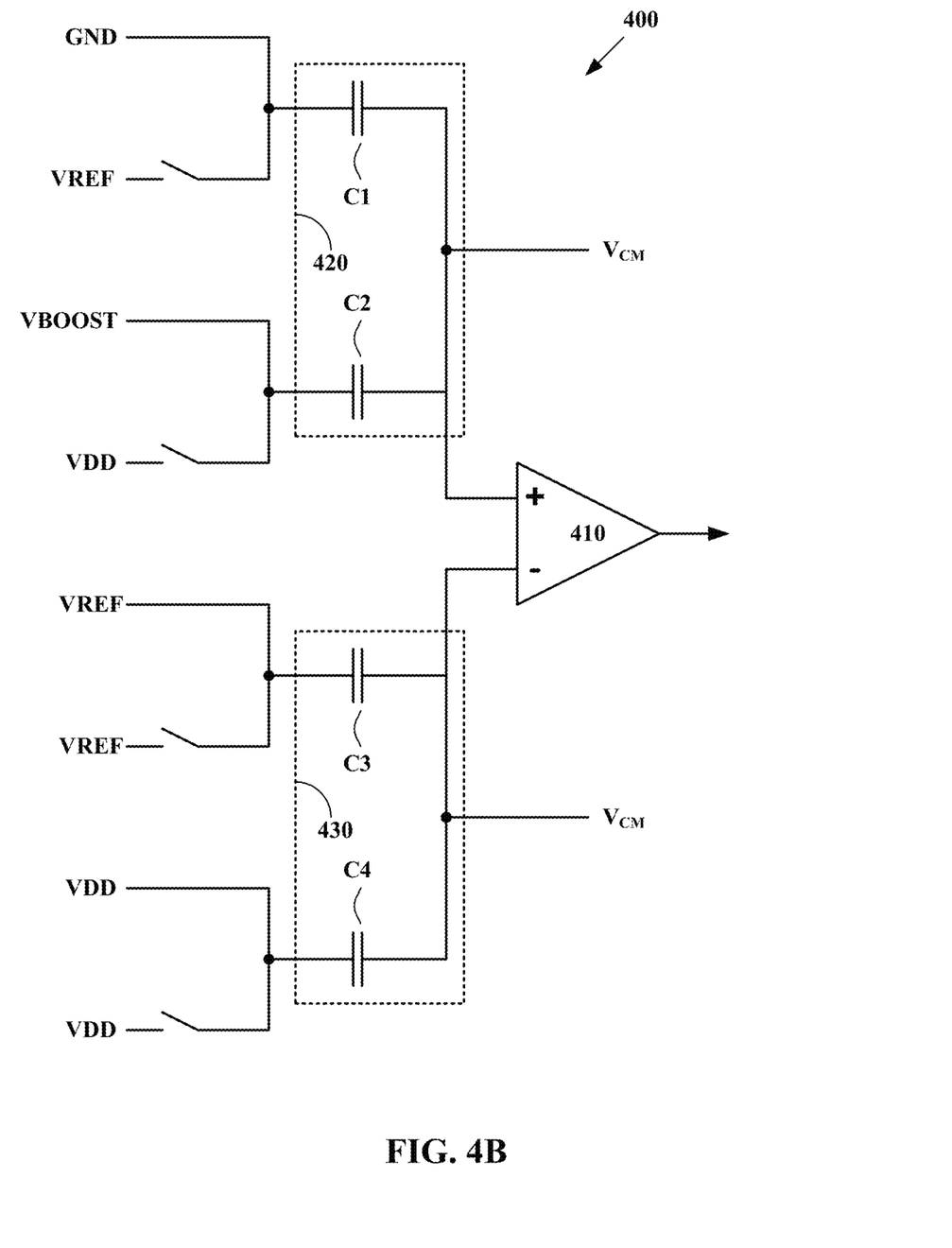
FIG. 4B is a diagram depicting the operation of the exemplary comparator circuit during one clock phase according to one aspect of the present invention.

The control switches SW4.1 -SW4.10 may impose various configurations on the voltage dividers in different phases of system operation. As shown in FIG. 4B, a first set of switches, SW4.1, SW4.3, SW4.5, SW4.7, SW4.9 and SW4.10 may close during a first operative phase, denoted as Φ1. Switches SW4.1 and SW4.3 may connect the first voltage divider 420 between $V_{BOOST}$ and ground. Switches SW4.5 and SW4.7 may connect the second voltage divider 430 between $V_{REF}$ and $V_{DD}$. Switches SW.9 and SW4.10 may set voltages at intermediate positions within the voltage dividers 420 and 430 (also the comparator's inputs) to common voltages, shown as $V_{CM}$. $V_{CM}$ is a common-mode voltage that may be needed for the comparator to function. Thus, regardless of the voltages presented to the voltage dividers 420, 430 by the switches SW4.1, SW4.3, SW4.5, SW4.7, voltages may be established at the comparator's inputs set to the $V_{CM}$ voltage.

Figure 4C:
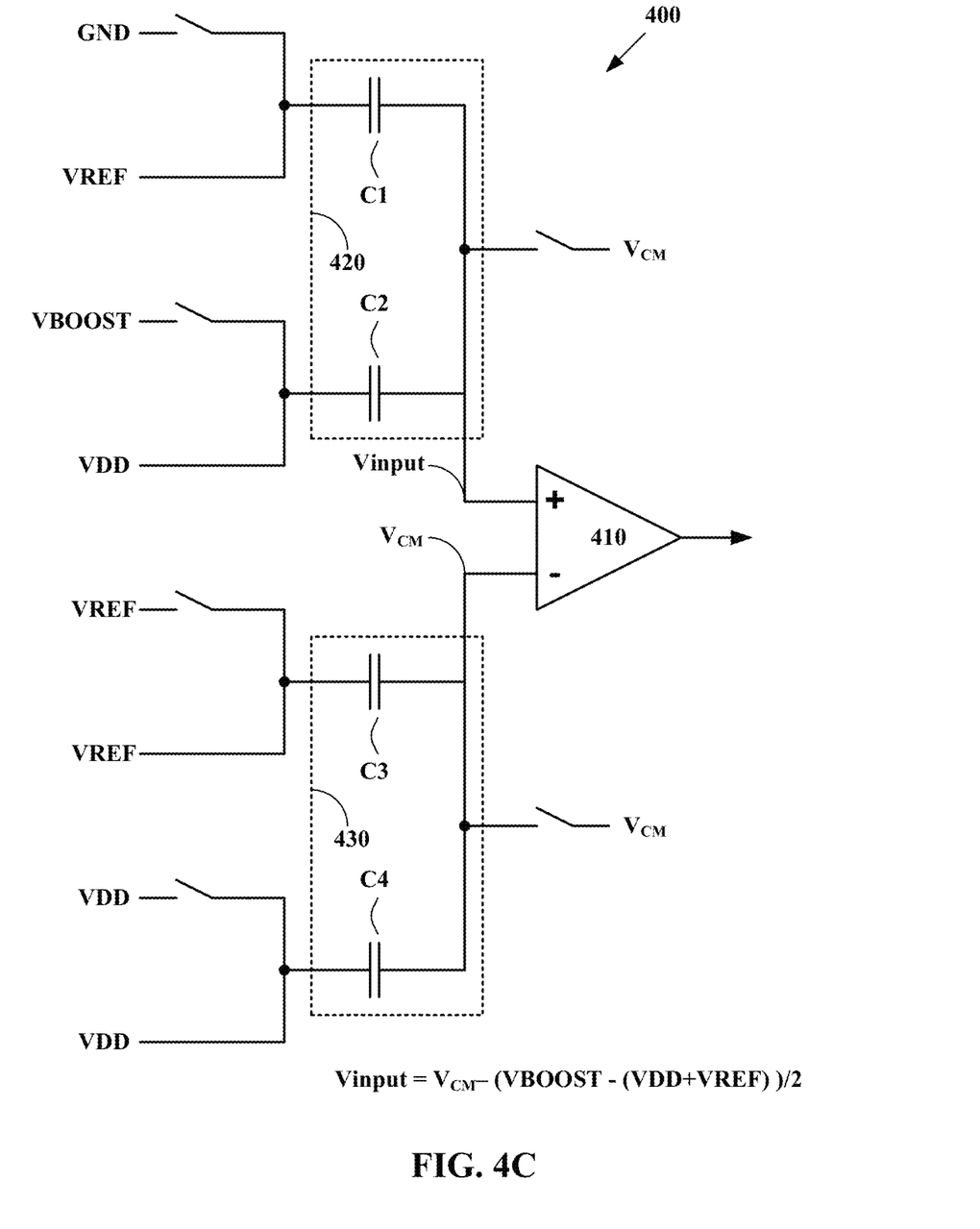
FIG. 4C is a diagram depicting the operation of the exemplary comparator circuit during a second clock phase according to one aspect of the present invention.

As shown in FIG. 4C, switches closed during Φ1 may open, and a second set of switches SW4.2, SW4.4, SW4.6 and SW4.8 may close during a second phase of operation, denoted as Φ2. Switches SW4.2 and SW4.4 may connect the first voltage divider 420 between $V_{REF}$ and $V_{DD}$. Switches SW4.6 and SW4.8 may connect the second voltage divider 430 between $V_{REF}$ and $V_{DD}$. The switches SW4.9 and SW4.10 may be open, which allows the voltage at the comparator's inputs to vary from $V_{CM}$ by charge redistribution within either voltage divider 420, 430.

It is expected that, absent some variation in $V_{REF}$ or $V_{DD}$, voltages at the intermediate node of voltage divider 430 will not vary. The voltage divider 430 is connected between $V_{REF}$ and $V_{DD}$ in both phases Φ1 and Φ2. Thus, the voltage divider 430 may present a voltage of $W_m$ to its input of the comparator 410. Voltages at the intermediate node of the first voltage divider 420, however, may vary based on differences in voltage among $V_{BOOST}$, $V_{REF}$, $V_{DD}$ and ground. Specifically, in this embodiment the first voltage divider 420 is expected to present a voltage to the comparator of $$V_{INPUT} = V_{CM} - \frac{1}{2}(V_{BOOST} - (V_{DD} + V_{REF})).$$

The $V_{CM}$ contributions of the two voltage dividers 420, 430 therefore cancel at the comparator 410. Since $V_{DD} + V_{REF}$ is $V_{TARGET}$ in this case, this configuration allows the comparator 410 to generate an output that reflects a difference between $V_{BOOST}$ and $V_{TARGET}$.

The embodiment of FIG. 4A finds application in circuit implementations where $V_{BOOST}$ and $V_{TARGET}$ may exceed maximum allowable voltages of the transistors that make up the integrated circuit. For example, it may be desirable to set $V_{TARGET}=3.2V$ in some circuit environments where such a voltage would cause transistor gate oxides to be damaged but where voltages at $V_{DD}$ or slightly higher (say, 2.2V) are tolerable. Thus, the voltage divider of the architecture of FIG. 4A reduces voltages to a manageable magnitude, permitting a comparator system to handle voltages that individually exceed the limits of transistors by differential comparison.

In practical implementation, switches SW4.5-SW4.8 may be omitted. The negative input to the comparator could be simply tied to $V_{CM}$. The implementation shown captures any clock feedthrough or channel charge so that the negative comparator input matches the positive comparator input.

Formulation of $V_{TARGET}$ as a summation of component voltages $V_{DD}$ and $V_{REF}$ is of particular utility in circumstances where one or both of these component voltages are used by circuits whose operation is adversely impacted by component voltage variations. For example, consider a circuit that uses $V_{DD}$ as its supply voltage and uses $V_{REF}$ internally. If $V_{REF}$ changes, but $V_{DD}$ does not, the values of ($V_{DD} - V_{REF}$) change, possibly causing problems with that circuit's operation. If for example a pass transistor in the circuit bases its gate-source voltage on ($V_{DD} - V_{REF}$), increases to $V_{REF}$ may cause the pass transistor to turn on insufficiently.

Now, consider if such a circuit is instead powered by an embodiment of the present invention as described above, i.e. the circuit is a load that uses $V_{BOOST}$ (which is regulated to match $V_{TARGET} = V_{DD} + V_{REF}$) as its supply voltage. Changes to $V_{REF}$ are also reflected in the regulated supply voltage $V_{BOOST}$ with the result that the values of ($V_{BOOST} - V_{REF}$) do not change, and adverse consequences that may have previously occurred may be avoided. Similarly, because a more constant basis for device gate-source voltages for example is available, it may be possible to use smaller devices than before.

Figure 5:
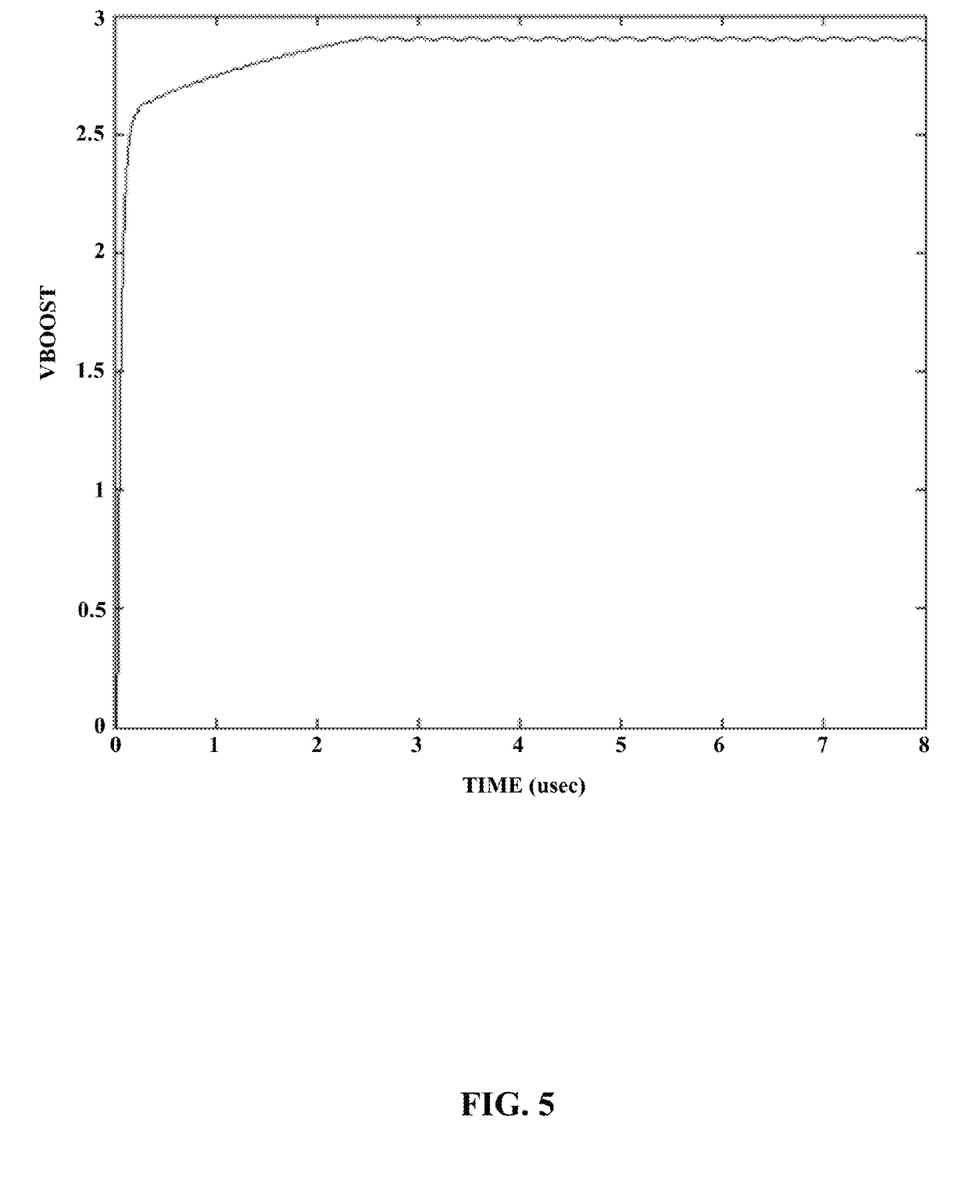
FIG. 5 is a diagram depicting the transient response of the exemplary voltage supply circuit according to one aspect of the present invention.

Referring now to FIG. 5, a diagram depicting the transient response of the exemplary voltage supply circuit is shown according to one aspect of the present invention. In this case, the output voltage is shown rising from zero volts to the target voltage in approximately 2.5 microseconds. Although the output voltage has settled, some output fluctuation is shown thereafter as the regulator connects and disconnects a single charge pump circuit to control the output voltage.

Figure 6:
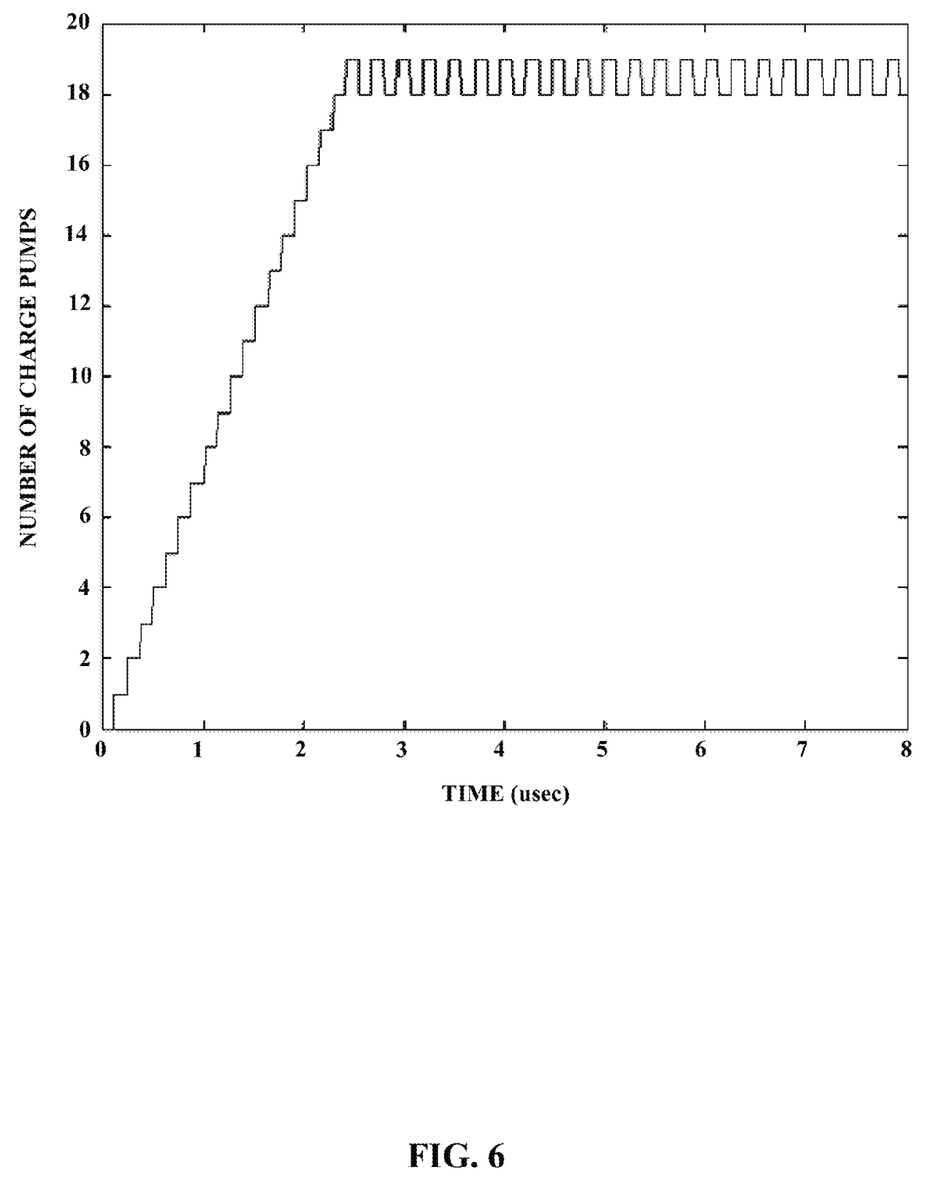
FIG. 6 is a diagram depicting the transient number of charge pumps connected to the load of the exemplary voltage supply circuit according to one aspect of the present invention.

Referring now to FIG. 6, a diagram depicting the transient number of charge pumps connected to the load of the exemplary voltage supply circuit is shown according to one aspect of the present invention. As the output voltage begins at zero and increases toward the target voltage in this example, the number of activated charge pumps increases as the comparator increments the counter. As the regulator reaches the target voltage, one charge pump is connected and disconnected repeatedly over time, as the regulator continues to maintain the target voltage.

Figure 7:
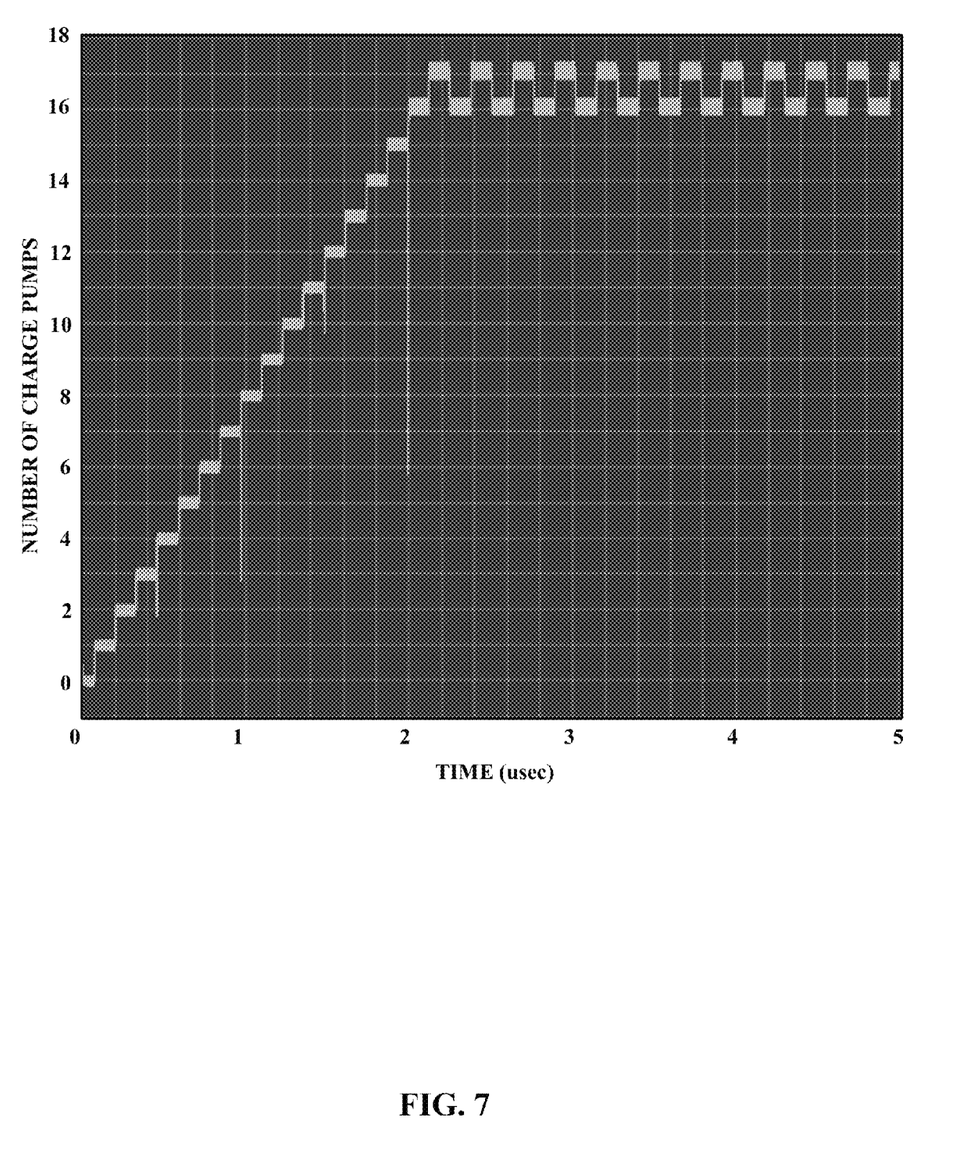
FIG. 7 is a diagram depicting a full circuit simulation of the transient output voltage of the exemplary voltage supply circuit according to one aspect of the present invention.

Referring now to FIG. 7, a diagram depicting a full circuit simulation of the transient output voltage of the exemplary voltage supply circuit is shown according to one aspect of the present invention. This result closely matches that of the linearized simulation, indicating the loop may be successfully modeled near its settled solution. The output voltage contains some quantization noise, as predicted. In one embodiment, the quantization noise may be reduced by simply letting the loop stabilize to a given output voltage, then freezing the comparator loop while the charge pump array continues to operate. This embodiment may operate by counting for a long enough period that $V_{BOOST}$ would be stable, then stopping the clock to the comparator.

Figure 8:
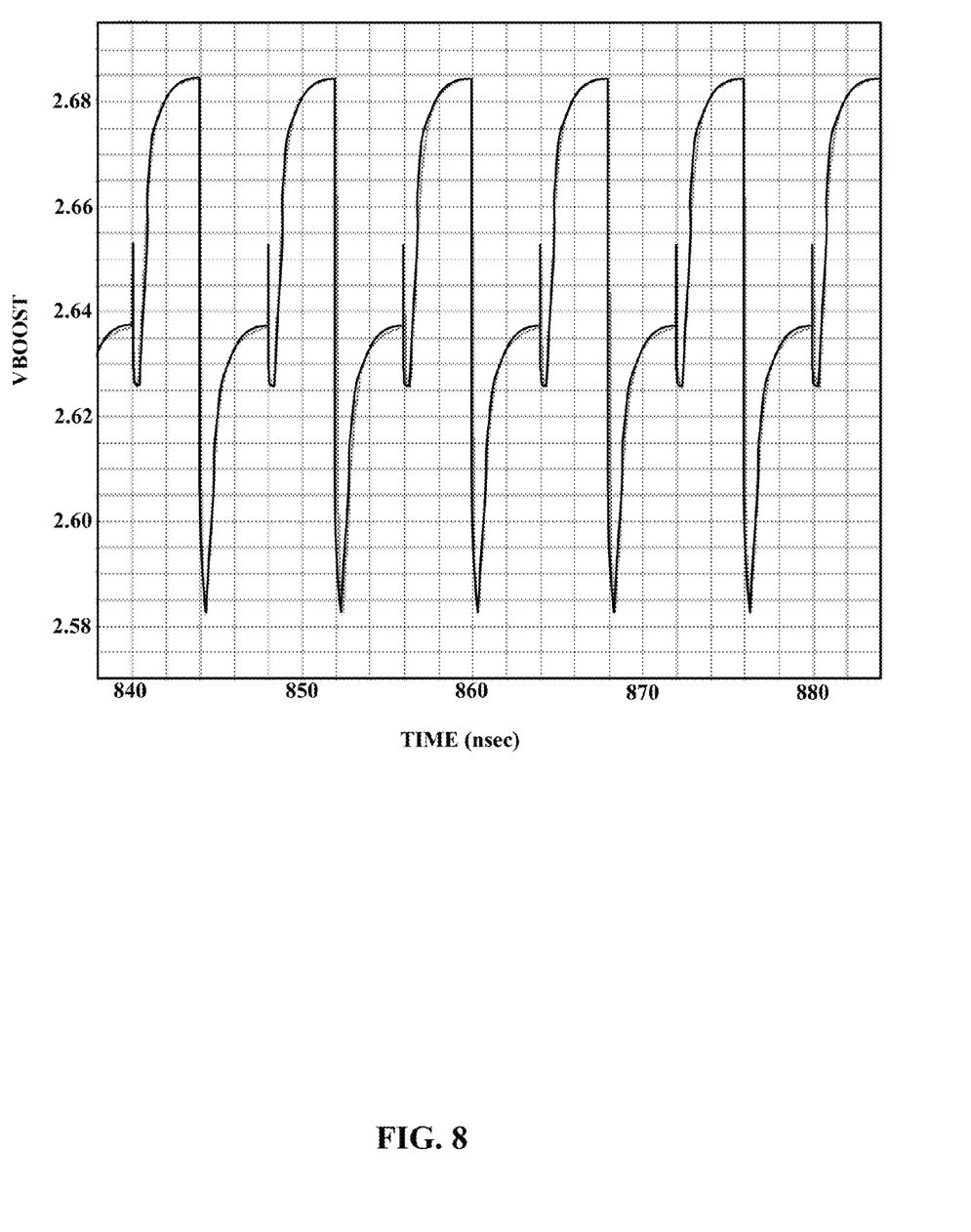
FIG. 8 is a diagram depicting a full circuit simulation of the output voltage fluctuation of the exemplary voltage supply circuit according to one aspect of the present invention.

Referring now to FIG. 8, a diagram depicting a portion of the full circuit simulation of the output voltage of the exemplary voltage supply circuit is shown according to one aspect of the present invention. The output voltage shown includes fluctuations due to a digital circuit load that drags the output voltage down to approximately 2.58 volts for an instant, before the charge pump array pushes the output voltage back up to around 2.64 volts, then half a clock cycle later all the way up to the desired exemplary target voltage of approximately 2.68 volts. This fluctuation persists as the average output voltage quickly settles to its final average value.

An alternative design approach would be to regulate an analog voltage to be equal to some multiple N of a reference voltage, then use that in the charge pump section so that the output is equal to $V_{DD}+N^*V_{REF}$. In this embodiment, the final voltage ($V_{DD}+N^*V_{REF}$) is outside the control loop and so may not be tracked. There is also significant overhead involved in an analog regulator implementation to generate the precisely regulated $N^*V_{REF}$ voltage or some portion of it. Also, some power may be lost to the regulation process, related to the voltage drop from the supply voltage used to the output voltage. Nevertheless, an analog voltage implementation may be appropriate for some use cases.

While particular embodiments of the present invention have been described, it is to be understood that various different modifications within the scope and spirit of the invention are possible. The invention is limited only by the scope of the appended claims.

As described above, one aspect of the present invention relates to a regulated boosted voltage supply. The provided description is presented to enable any person skilled in the art to make and use the invention. For purposes of explanation, specific nomenclature is set forth to provide a thorough understanding of the present invention. Description of specific applications and methods are provided only as examples. Various modifications to the preferred embodiments will be readily apparent to those skilled in the art and the general principles defined herein may be applied to other embodiments and applications without departing from the spirit and scope of the invention. Thus the present invention is not intended to be limited to the embodiments shown, but is to be accorded the widest scope consistent with the principles and steps disclosed herein.

As used herein, the terms "a" or "an" shall mean one or more than one. The term "plurality" shall mean two or more than two. The term "another" is defined as a second or more. The terms "including" and/or "having" are open ended (e.g., comprising). Reference throughout this document to "one embodiment", "certain embodiments", "an embodiment" or similar term means that a particular feature, structure, or characteristic described in connection with the embodiment is included in at least one embodiment. Thus, the appearances of such phrases in various places throughout this specification are not necessarily all referring to the same embodiment. Furthermore, the particular features, structures, or characteristics may be combined in any suitable manner on one or more embodiments without limitation. The term "or" as used herein is to be interpreted as inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

In accordance with the practices of persons skilled in the art of computer programming, embodiments are described with reference to operations that may be performed by a computer system or a like electronic system. Such operations are sometimes referred to as being computer-executed. It will be appreciated that operations that are symbolically represented include the manipulation by a processor, such as a central processing unit, of electrical signals representing data bits and the maintenance of data bits at memory locations, such as in system memory, as well as other processing of signals. The memory locations where data bits are maintained are physical locations that have particular electrical, magnetic, optical, or organic properties corresponding to the data bits.

When implemented in software, the elements of the embodiments are essentially the code segments to perform the necessary tasks. The non-transitory code segments may be stored in a processor readable medium or computer readable medium, which may include any medium that may store or transfer information. Examples of such media include an electronic circuit, a semiconductor memory device, a read-only memory (ROM), a flash memory or other non-volatile memory, a floppy diskette, a CD-ROM, an optical disk, a hard disk, a fiber optic medium, etc. User input may include any combination of a keyboard, mouse, touch screen, voice command input, etc. User input may similarly be used to direct a browser application executing on a user's computing device to one or more network resources, such as web pages, from which computing resources may be accessed.

We claim:

1. A voltage regulator circuit, comprising:
   an array of charge pumps each having an output coupled to a common output node;
   a comparator having first and second inputs;
   a controller having an input coupled to an output of the comparator and having an output for a selection signal being input to the array of charge pumps, the selection signal determines a number of charge pumps to be activated; and
   a voltage divider network comprising:
   a pair of voltage dividers comprising a first voltage divider and a second voltage divider, each of the first and second voltage dividers having an intermediate node thereof coupled to a respective input of the comparator;
   a first switch network that connects the first voltage divider to ground and to the common output node in a first phase of operation, and the first switch network further connects to a supply voltage and to a reference voltage in a second phase of operation; and
   a second switch network that connects the second voltage divider to the reference voltage and to the supply voltage in both of the first and second phases of operation,
   wherein the comparator compares an average of the reference voltage and the supply voltage against an average of an output voltage and ground.

2. The voltage regulator circuit of claim 1, wherein the array of charge pumps is a binary-weighted array.

3. The voltage regulator circuit of claim 1, wherein the charge pumps are switched by a clock with a frequency that is a multiple of a clock frequency of the controller.

4. The voltage regulator circuit of claim 3, wherein the multiple is sixteen.

5. The voltage regulator circuit of claim 1, wherein the comparator compares a reduced version of the output voltage against a reduced version of a target voltage.

6. The voltage regulator circuit of claim 5, wherein the target voltage is the supply voltage increased by the reference voltage.

7. The voltage regulator circuit of claim 6, wherein the reference voltage is one of 1.0 volt and 1.4 volts.

8. The circuit of claim 6, wherein the supply voltage is 1.8 volts.

9. The voltage regulator circuit of claim 5, wherein the voltage divider network reduces the output voltage and the target voltage from a first voltage level that exceeds a maximum voltage rating of transistors in the voltage regulator circuit to a second voltage level that meets the maximum voltage rating of the transistors in the voltage regulator circuit.

10. The voltage regulator circuit of claim 5, wherein the target voltage is the supply voltage decreased by the reference voltage.

11. The voltage regulator circuit of claim 1, wherein the controller includes an accumulator.

12. The voltage regulator circuit of claim 1, wherein the controller includes an integrator.

13. The voltage regulator circuit of claim 1, wherein the controller includes an up/down counter whose count is controlled by the comparator.

14. The voltage regulator circuit of claim 1, wherein:
the controller further comprises a counter that increments or decrements a counter number in response to an adjustment signal from the comparator; and
the charge pumps further comprise respective logic gates that connect a counter number of the charge pumps to the common output node.

15. The voltage regulator circuit of claim 1, further comprising a filter to limit loop gain and frequency response.

16. The voltage regulator circuit of claim 1, wherein the first and second voltage dividers each comprise a switched capacitor network.

17. A method of regulating a load voltage with a voltage regulator circuit, comprising:
iteratively comparing a reduced version of the load voltage to a reduced version of a target voltage;
accumulating results of a plurality of comparisons; and
selecting a subset of charge pumps of a charge pump array connected to a load based on the accumulated results,
wherein the iterative comparing compares an average of a reference voltage and a supply voltage against an average of the load voltage and ground, and is performed by:
a pair of voltage dividers comprising a first voltage divider and a second voltage divider, each of the first and second voltage dividers having an intermediate node thereof coupled to a respective input of a comparator;
a first switch network that connects the first voltage divider to ground and to an output of the charge pump array in a first phase of operation, and the first switch network further connects to the supply voltage and to the reference voltage in a second phase of operation; and
a second switch network that connects the second voltage divider to the reference voltage and to the supply voltage in both of the first and second phases of operation.

18. The method of claim 17, wherein the subset of charge pumps are switched by a clock with a frequency that is a multiple of a clock frequency of the circuit.

19. The method of claim 18, wherein the multiple is sixteen.

20. The method of claim 17, wherein the target voltage is the supply voltage increased by the reference voltage.

21. The method of claim 20, wherein the reference voltage is one of 1.0 volt and 1.4 volts.

22. The method of claim 21, wherein the supply voltage is 1.8 volts.

23. The method of claim 17, further comprising reducing the load voltage and the target voltage from a voltage level that exceeds a maximum voltage rating of transistors in the voltage regulator circuit to a different voltage level that meets that maximum voltage rating of the transistors in the voltage regulator circuit, using the first and second voltage dividers.

24. The method of claim 17, wherein the voltage regulator circuit further comprises:
a counter that increments or decrements a counter number in response to an adjustment signal from the comparison; and
logic gates that connect a counter number of the charge pumps to the load.

25. The method of claim 17, wherein the voltage regulator circuit comprises a filter to limit loop gain and frequency response.

26. The method of claim 17, wherein the target voltage is the supply voltage decreased by the reference voltage.

27. The method of claim 17, wherein the first and second voltage dividers each comprise a switched capacitor network.

28. A system for regulating a load voltage with a voltage regulator circuit, comprising:
a charge pump array;
means for comparing a reduced version of the load voltage from an output of the charge pump array with a reduced version of a target voltage; and
means for activating a number of charge pumps based on the means for comparing,
wherein the means for comparing compares an average of a reference voltage and a supply voltage against an average of the load voltage and ground, and comprises:
a pair of voltage dividers comprising a first voltage divider and a second voltage divider, each of the first and second voltage dividers having an intermediate node thereof coupled to a respective input of a comparator;
a first switch network that connects the first voltage divider to ground and to the output of the charge pump array in a first phase of operation, and the first switch network further connects to the supply voltage and to the reference voltage in a second phase of operation; and
a second switch network that connects the second voltage divider to the reference voltage and to the supply voltage in both of the first and second phases of operation.

29. The system of claim 28, wherein the means for activating includes an accumulator.

30. The system of claim 28, wherein the means for activating includes an integrator.

31. The system of claim 28, wherein the means for activating includes an up/down counter whose count is controlled by the comparator.

32. The system of claim 28, wherein the means for comparing reduces the load voltage and the target voltage from a voltage level that exceeds a maximum voltage rating of transistors in the voltage regulator circuit to a different voltage level that meets the maximum voltage rating of the transistors in the voltage regulator circuit.

33. The system of claim 28, wherein the target voltage is the supply voltage decreased by the reference voltage.

34. The system of claim 28, wherein the first and second voltage dividers each comprise a switched capacitor network.

* * * * *